United States Patent [19]
Holdgrafer

[11] Patent Number: 5,119,436
[45] Date of Patent: Jun. 2, 1992

[54] METHOD OF CENTERING BOND POSITIONS

[75] Inventor: William J. Holdgrafer, Burlington, N.J.

[73] Assignee: Kulicke and Soffa Industries, Inc, Willow Grove, Pa.

[21] Appl. No.: 587,301

[22] Filed: Sep. 24, 1990

[51] Int. Cl.⁵ .............................................. G06K 9/00
[52] U.S. Cl. ...................................... 382/8; 358/101; 382/34
[58] Field of Search ................. 382/8, 3, 34; 358/101, 358/106, 107; 368/513; 356/399, 388

[56] References Cited

U.S. PATENT DOCUMENTS

| | | | |
|---|---|---|---|
| 4,334,241 | 6/1982 | Kashioka et al. | 382/8 |
| 4,450,579 | 5/1984 | Nakashima et al. | 382/8 |
| 4,805,224 | 2/1989 | Koezuka et al. | 382/30 |
| 4,847,911 | 7/1989 | Morimoto et al. | 358/101 |
| 4,855,928 | 8/1989 | Yamanaka | 382/8 |
| 4,891,767 | 1/1990 | Rzasa et al. | 364/513 |
| 4,894,790 | 1/1990 | Yotsuya et al. | 382/8 |
| 4,955,062 | 9/1990 | Terui | 382/8 |
| 4,974,077 | 11/1990 | Kusaba | 358/107 |

Primary Examiner—David K. Moore
Assistant Examiner—Joseph Mancuso
Attorney, Agent, or Firm—John B. Sowell

[57] ABSTRACT

A method for increasing accuracy and reducing the time required to teach the target bonding points on a reference semiconductor device and its associated lead frame comprises manually approximately locating at least a first target bonding point and at each approximately located bonding point causing the pattern recognition system (PRS) of an automatic wire bonder to relocate the exact center of preferred target bonding point automatically. The direction and approximate distance to the next point is programmed into the PRS to enable the PRS to automatically step to the next approximate location of a next bonding point or a pad or a lead. At each pad or lead the PRS is programmed to find or relocate this bonding point at the exact center or preferred target bonding point on the lead or pad. It is possible to program such automatic teach operations on pads or leads over a complete semiconductor or preferably over a plurality of pads or leads arranged in continuing direction and spaced from each other by a predetermined pitch. During bonding of production semiconductor devices the taught bonding points are employed as approximate bonding points which causes the PRS to again relocate the exact preferred target bonding points with reference to the PRS located edges of the pads and leads to be bonded.

15 Claims, 6 Drawing Sheets

METHOD OF CENTERING BOND POSITIONS

FIELD OF THE INVENTION

The present invention relates to vision systems of the type employed on wire bonders and die bonders. More specifically, the present invention relates to a novel method for locating a preferred target bond position on a semiconductor device and on a lead frame which form the interconnection points for fine wires during a bonding operation using automatic wire bonding machines and associated vision systems.

DESCRIPTION OF THE PRIOR ART

Heretofore, automatic wire bonders were known and are classified in U.S. class 228, sub class 4.5 (International Class B23K 20/000). Typical of the early automatic wire bonders is U.S. Pat. No. 4,266,710 which was programmable to be taught predetermined first and second bond positions that could be repeated in a manner similar to numerical control machines to form repeat operations on semiconductor devices in production.

Heretofore, vision systems or pattern recognition systems (PRS) were known and are classified in U.S. class 382, sub class 8 (International Class G06K 9/32). Typical of the early vision systems adapted to be used on automatic wire bonders is U.S. Pat. No. 4,441,205 which was programmable to automatically find the exact X and Y and rotational position of a semiconductor device to be wire bonded using a novel signature generated by adding rows of columns of pixel gray scale intensity values and comparing portions of the generated signature produced from the device to be located with a previously taught sub signature learned (or taught) from a reference semiconductor device whose position was known. The pads on the referenced semiconductor device were also taught during a simulated bonding teach operation. If the production devices were made very accurately, the position of the electrode bonding paths were at the same location taught on the reference device and bonding without relocating the bonding targets was capable of producing high yields of bonded devices.

In using the above mentioned wire bonding patent and the associated vision system patent, it was assumed that the first bond made on bonding pads of the semiconductor were at the predetermined taught positions located manually on the reference device during the teach operation prior to automatic bonding operations on production devices. Further, it was originally assumed that the second bond positions taught on a reference lead frame could be employed to locate second bond positions on production lead frame devices, however, it was found that very high density devices and lead frames did not provide repeatable pretaught locations for second bond positions and it has become necessary to employ some method of checking to determine if the lead frame to which the second bond was to be attached was at the predetermined assumed position. In copending U.S. application Ser. No. 07/085,240, filed Aug. 7, 1987 and assigned to the assignee as the present invention the pattern recognition system was modified to provide an image processing system and a method of verifying the location of the position of the leads on the lead frame. This application teaches that it is possible to locate a candidate lead on a lead frame. Due to false reflections and dark areas on the background between the candidate leads it was necessary to carry out a series of checks and comparisons which consumed enough time to delay the speed of making wire bonded fine wire interconnections between a lead out electrode pad on a semiconductor device and a lead out terminal (or bonding position) on a lead frame. Applicant has concluded that it would be extremely desirable to provide a method and means of substantially improving the accuracy of both the first and second bond position so that all bonds are centered on the pads and leads with sufficient accuracy to meet military specifications, increase the yield of acceptable bonded semiconductor devices and actually increase the bonding speed throughput of devices being bonded.

SUMMARY OF THE INVENTION

It is a principal object of the present invention to decrease the time required to teach exact bonding target positions on referenced semiconductor pads and lead frame leads where first and second fine wire bonding interconnections will be made on production semiconductors and lead frames.

It is another primary object of the present invention to increase the accuracy of the location of the first and second bond positions during a teach operation while decreasing the time required to conduct a complete teach operation.

It is another principal object of the present invention to provide a method and means for performing a teach operation using an automatic wire bonder which may be performed by relatively unskilled labor.

It is another principal object of the present invention to automatically locate the semiconductor pads and lead frame leads during an automatic wire bonding operation without decreasing the speed of making wire bonds.

It is another principal object of the present invention to provide a method of locating the exact target bond positions of the next first and second bond positions while performing a wire bonding operation on a previously located first and second bond position.

It is another principal object of the present invention to locate the exact predetermined optimum bonding target on each semiconductor pad and lead frame lead during an automatic wire bonding operation.

It is a general object of the present invention to provide a method and means for substantially eliminating all off center bonds.

It is a general object of the present invention to provide a method and means for eliminating second bond misses.

It is a general object of the present invention to provide a method and means for reducing product overruns by at least one order of magnitude.

It is another general object of the present invention to provide a method and means for reducing the time required for a teach operation by as much as 90%.

It is another general object of the present invention to increase the speed of production of small batches of semiconductor devices and yet provide higher yields.

According to these and other objects of the present invention there is provided apparatus for setting the pad size of a semiconductor pad during a teach operation as well as setting the bonding direction, pitch and number of pads to be located in a series of teach operations. The pattern recognition system on the automatic wire bonder is provided with an electronic indicia for indicating the taught bonding target and is automatically advanced to the next bonding target where the pattern recognition system performs a scan operation which automatically centers itself on the next bonding target using pre-programmed parameters. When there are missing bonding pads or missing leads, the teach operation is automatically interrupted and a position is "skipped", then the next series of bonding positions is taught. Similarly, when the direction, or pitch or lead width changes over a new series of bonding targets, a new teach operation is conducted until all of the first and second bond positions are taught. The information taught may be reviewed and verified before being confirmed and entered as a bonding program. During production wire bonding operations of semiconductor devices to lead frames, the taught bonding program is only used to step the pattern recognition system from one bonding target to the next where the actual bonding point is relocated by the pattern recognition system in order to compensate for differences between bonding points on production devices and production lead frames that differ from the referenced device and the referenced lead frame used to generate the bonding program during the teach operation.

DESCRIPTION OF THE PREFERRED EMBODIMENT

Figure 1:
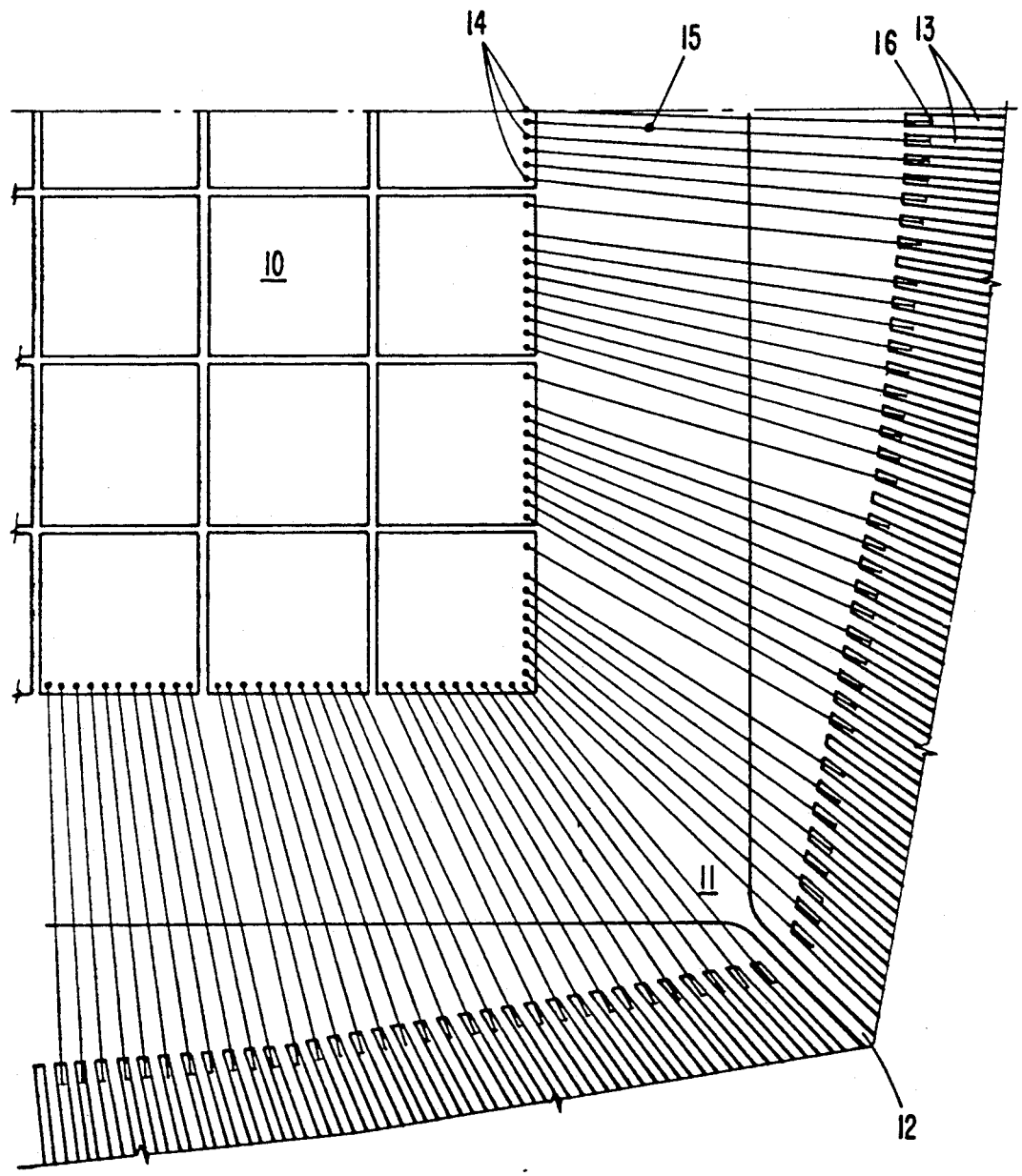
FIG. 1 is an enlarged detail of a corner of a high pin count semiconductor device mounted on a lead frame at the ground plane and having lead frame leads juxtaposed to pads on the semiconductor device.

Refer now to FIG. 1 showing an enlarged detail of a test semiconductor device which was produced to simulate a 304 pin chip with 76 bond points on each side and having skipped spaces between some of the semiconductor pad bond points so as to present an irregular pitch high count device. Further, the test device was produced to simulate an actual semiconductor product to be manufactured for computer applications. Semiconductor device 10 is shown bonded to a ground plane or die paddle 11 connected to a lead frame (not shown) by a tie 12. The lead frame also supports the numerous lead frame leads 13 which are juxtaposed the bonding pads 14 on the periphery of the semiconductor device. Sometimes the pads 14 are referred to as lead out pads or electrodes which are to be bonded by interconnecting a fine gold wire between the pads 14 and a target 16 located at a predetermined distance from the tip of the lead frame leads 13. It will be noted that the lead frame leads 13 are not at constant distance from their associated bonding pads 14 nor are they arranged in a straight or linear fashion nor do the leads have tips which are squared off relative to the axis of the lead frame leads 13. The very high density of this and other similar devices allows substantially no leeway for error in locating the bonding targets at the center of the lead frame leads 13. In some such devices the clearance distance between lead frame leads 13 is so great that the fingers or leads can be bent and moved relative to each other a distance greater than the width of the lead frame lead without touching each other, which is desirable to avoid shorts and inoperable devices However, if this occurs in either the reference semiconductor device or the production semiconductor device, it is obvious that the second bond will not be made at the center of the lead frame lead and a very expensive semiconductor device may be damaged beyond repair Some of these devices now are costing thousands of dollars when bought in quantity.

Figure 2:
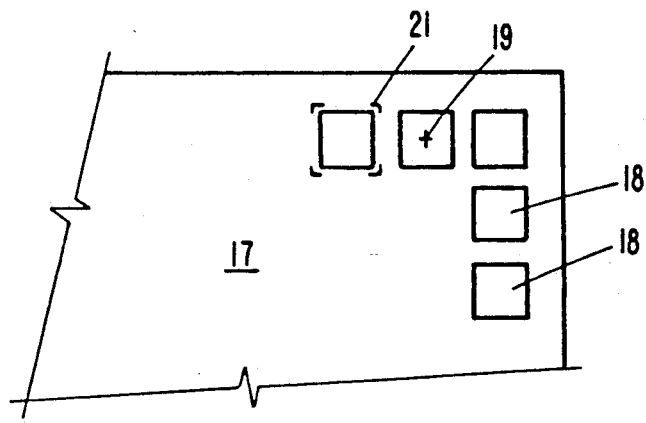
FIG. 2 is an enlarged detail of a corner of another semiconductor device showing the pads on the device very close to each other.

Refer now to FIG. 2 showing a greatly enlarged detail of a corner of another semiconductor device 17 having a plurality of similar size pads 18. As a typical example, the pads shown could be approximately 3½ mils on each side and arranged on a 5 mil pitch leaving only 1½ mils space between pads. Superimposed on one of the pads 18 is a cross-hair 19 and on another pad 18 is a pad outline 21. The purpose for showing the electronically generated cross-hair 19 and pad outline 21 is to show what appears on the television display screen as electronically generated indicia used as an aiming point to locate the center of the bonding pads 18 where the first bond will be made by an automatic wire bonder. Other types of electronically generated indicia have been employed such as other trigonometric shapes to locate the center bonding point. It is known that a ball wire bonder bonds a ball, which is made at a first bond on to a pad 18 which mashes out to 1½ to 2½ times the diameter of the wire. If the wire is a 1 mil wire and the pad is a 3.5 mil pad, it is necessary to locate the center bonding point with the automatic wire bonder and its bonding tool to at least one-half of 1 mil to assure that the ball or ball bond is made within the perimeter of the pad 18 to meet a mil spec or best production quality. Ordinarily the bonding pads 18 are made by semiconductor photolithographic processes using mask techniques which permit defining the lines within one-third of 1 micron or 1/100th of a mil. Thus, if the pads are made on the semiconductor device with the most exacting processes available using the latest state-of-the-art equipment they can be accurately located relative to each other and relative in size. Heretofore it was not manually possible to locate the first ball bond at the exact center of an accurately produced bonding pad 18 during a teach operation. Manufacturers of high density semiconductor devices were required to make oversize bonding pads 18 displaced from each other by greater distances than would be required for insulation and design purposes. It will be explained hereinafter that the present invention allows the manufacturers of high density semiconductor devices to shrink the bonding pads 18 and also shrink the peripheral area on which the bonding pads are located by placing them closer to each other.

Figure 3:
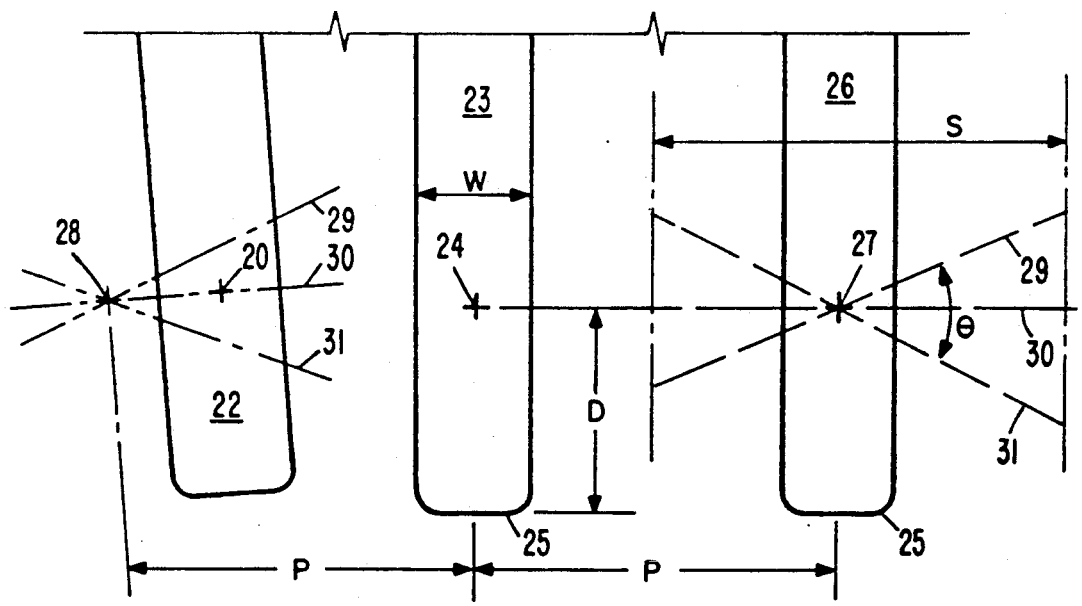
FIG. 3 is an enlarged detail of three lead frame leads showing irregular spacing and widths of typical leads on which second bonds are to be made.

Refer now to FIG. 3 showing an enlarged detail of three lead frame leads showing irregular spacing and widths of typical leads which are encountered in production. Typically low count lead frames are stamped with precise stamping dies and typically high lead count lead frames are etched using photoresist techniques which increase the accuracy of location of the leads but produce something to be desired on the edge configuration as well as producing fragile fingers which are cantilevered into space. Lead 22 is shown being wider at its tip than along its beam type body. Lead frame lead 23 is shown having a fairly consistent width W' but is shown as being irregular as a result of acid etching. The desired target point for the second bond is shown by the cross 24 located at a predetermined preferred distance D from the tip 25 of the lead 23. Lead frame lead 26 is typical of a smooth edge acid etched lead frame lead having a predetermined pitch P distance from its adjacent lead 23 and could ordinarily be bonded at its target point 27 employing the prior art techniques using predetermined bonding points located on a referenced device. However, the pitch P from the target point 24 to the target point 28 is completely off the lead 22 and if bonded using predetermined bonding points taught on referenced devices would result in a missed lead and/or a damaged device.

Assume for purposes of this explanation that a teach operation is being conducted and the aforementioned cross-hair is located over the target point 27 and that the number of leads to be located and the distance from the tip of the lead D is entered into the computer with the pitch P and the width W of the leads. The desired bonding point 27 is entered manually and the vision system is programmed to conduct a scan operation shown by the scan lines 29 to 31 which are representative of a 180° theta scan conducted over 5° increments which determines the orientation of the lead 26 by finding the minimum width W. Thus, it will be understood that the width information W may be obtained automatically and need not be programmed for most teach operations. The narrowest width W occurs along the scan line 30 which is perpendicular to the edge of the lead 26. Having found the edges of the lead 26 it is now possible to electronically relocate the target point 27 even though it may have not been in the exact center of the lead 26. Thus, an unskilled operator that is capable of getting the cross-hair 24 at any target point 27 an a lead 26 has the target bonding point 27 automatically located at the center of the lead in the present invention. Having electronically located the preferred center 27 of the lead 26, it is possible to conduct an orthogonal scan and locate the tip 25 of lead 26. Similarly, the bonding point or target point 27 is relocated by the distance D from the edge 25 to the new target point 27 resulting in the taught bonding point 27 being at an exact predetermined distance D at the center of lead 26. It is now possible to step a distance P from the new point 27 to an adjacent lead at its approximate bonding point location and repeat the process so that the new bonding point 24 for lead 23 is located at the center of the lead 23 at a preferred predetermined distance D from the tip 25. When the novel programmed pattern recognition system is employed in the teach operation to find the preferred bonding point of lead 22, the assumed bonding point 28 is off the lead 22. However, the scan lines 29 to 31 are conducted over a space or area S which embraces both edges of leads 22 and locates the two side edges of lead 22 and locates its scan line 30 orthogonal to the edges of lead 22 as explained hereinbefore. After locating the center target point 20 Of the lead 22, the distance D is determined from the center point and the final target point 20 is then located even though the lead 22 is skewed from its normal axis. It will be understood that sequential stepping and locating of the actual center of the leads at a preferred distance D can be accomplished on any number of leads that have a similar pitch P. When the device being bonded is similar to the device 10, it will reach a point where no interconnecting wire is to be connected to one of the leads. At this point, the operator presses a skip button which enable the pattern recognition system to skip over a single lead and start repeating the series of lead recognition and target point location operations as explained hereinbefore. It is possible to step from one lead to another or automatically step through a number of leads or interrupt a sequence of operations so that the teach operation is conducted substantially automatically by unskilled operations.

It is possible to do a location operation on all of the pads 14 before proceeding to locating the target points on all of the leads 13. It is also possible to teach from pad to lead alternately knowing the pitch between the pads and the pitch between the leads because all the pattern recognition system has to know is to be informed whether it is to locate a first bond or second bond target and the sequence to be followed. On a high pin count device similar to that shown in FIG. 1, locating manually the precise locations of the bonding points during a teach operation may require four hours. However, this time can be reduced to approximately 15 minutes using the present invention. Since the teach operation in the present invention is only used for the approximate location for production bonding it will be understood that the final bond positions are much more accurately located than was possible using the prior art methods and apparatus.

Figure 4:
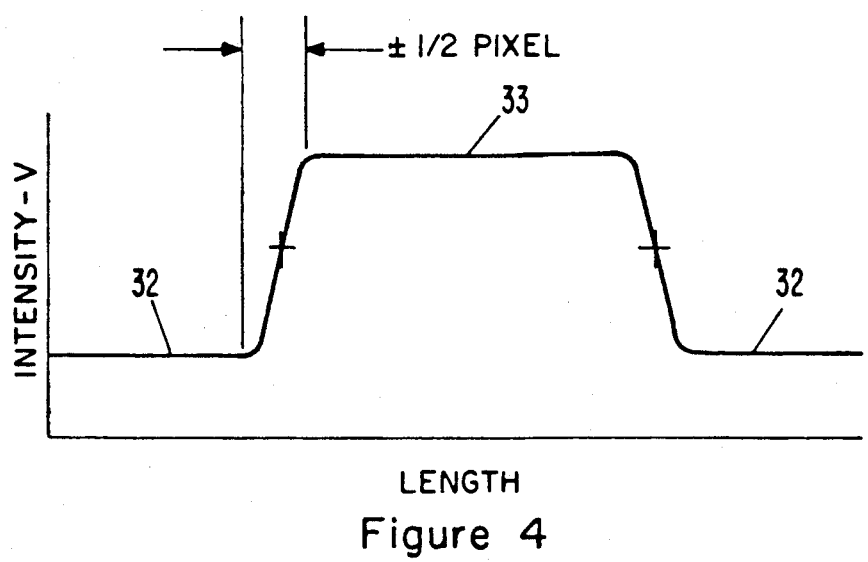
FIG. 4 is a schematic diagram of a raw video signal showing an increased gray level intensity value which occurs where a pad or lead is found.
Figure 5:
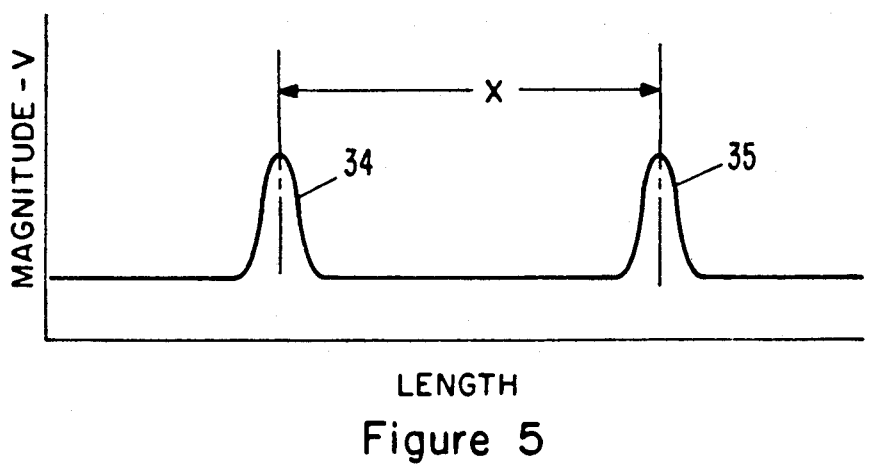
FIG. 5 is a schematic diagram of a processed video signal of the wave form shown in FIG. 4.
Figure 6:
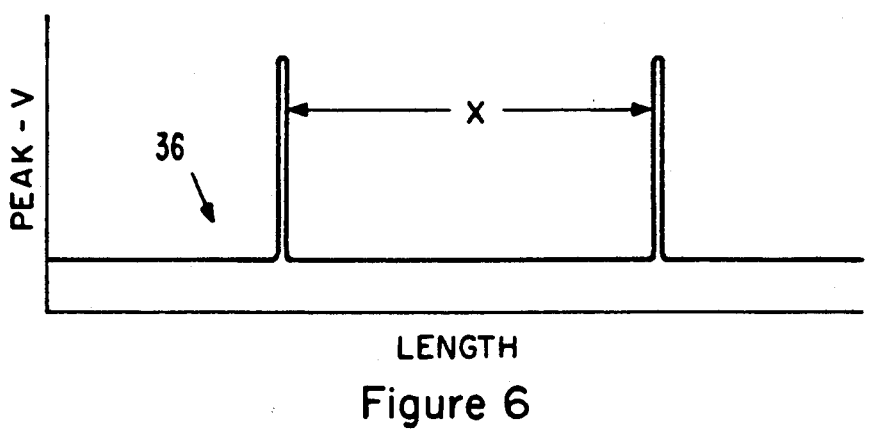
FIG. 6 is a schematic diagram of a processed wave form signal of the wave form shown in FIG. 5 showing peaks indicative of edges of pads or leads.

Refer now to FIGS. 4, 5 and 6 showing wave forms employed in the pattern recognition system of the preferred embodiment of the present invention to rapidly find edges of pads and leads. The pattern recognition system of the type shown and described in U.S. Pat. No. 4,441,205 and other commercially available pattern recognition systems all employ video cameras to produce analog signals which may be converted into digital signals and stored in the memory of the associated computer system. The values stored are gray scaled intensity values of the individual pixels and are preferably mapped as full frame maps and/or corridors of the video image. Thus, FIG. 4 is representative of the value of a corridor of information stored in the memory of the pattern recognition system along a scan line which traverses either a pad or a beam. The intensity level shown at point 32 is off lead or off pad and the intensity ramps up over approximately a half pixel to the high reflectivity level or high intensity level 33 as it crosses over a highly reflective lead or pad. Similarly, the intensity level when it reaches the opposite edge ramps down over a half pixel displacement to the same level 32 after leaving the metalized layer of the pad or lead. In the preferred embodiment of the present invention, the information in digital form shown in FIG. 4 may be differentiated so as to produce magnitude peaks 34 and 35 which occur at the ramp up and ramp down portions of curve 32, 33. It is now only necessary to find the center averaged line of the peaks 34 and 35 to determine the edges of the metalized layer of the pad or lead being scanned. The distance X between the center of the peaks 34, 35 is indicative of either a width W of a lead or the side of a pad as the case may be and this distance X may be used to check that the area being scanned on the semiconductor device is truly a pad or a lead. Wave form 36 of FIG. 6 is indicative of the information processed in the computer to determine the distance X between peaks 34 and 35. Several different methods may be employed to compute the peak locations such as paraboloid fit, signature and sub-signature comparison and/or peak detection. However, the fastest and most reliable of these methods is the preferred method for the present invention. In theory, comparison of signatures with sub-signatures should produce the fastest accurate result. However, paraboloid fit comparison will produce greater accuracy and can be performed by high speed computer chips dedicated to the process. It is possible in the present invention to perform the teach operation to obtain the suggested taught bonding program and to start the actual production at a predetermined pad or lead. The automatic wire bonder then bonds a pad to a lead while the pattern recognition system is calculating the actual bonding points for the pads and leads to be bonded next. Thus, it will be understood that in the present invention there is no requirement that the actual bonding points be located at any particular time, however, it is more efficient to locate some or all bonding targets prior to the time bonding will occur.

Figure 7:
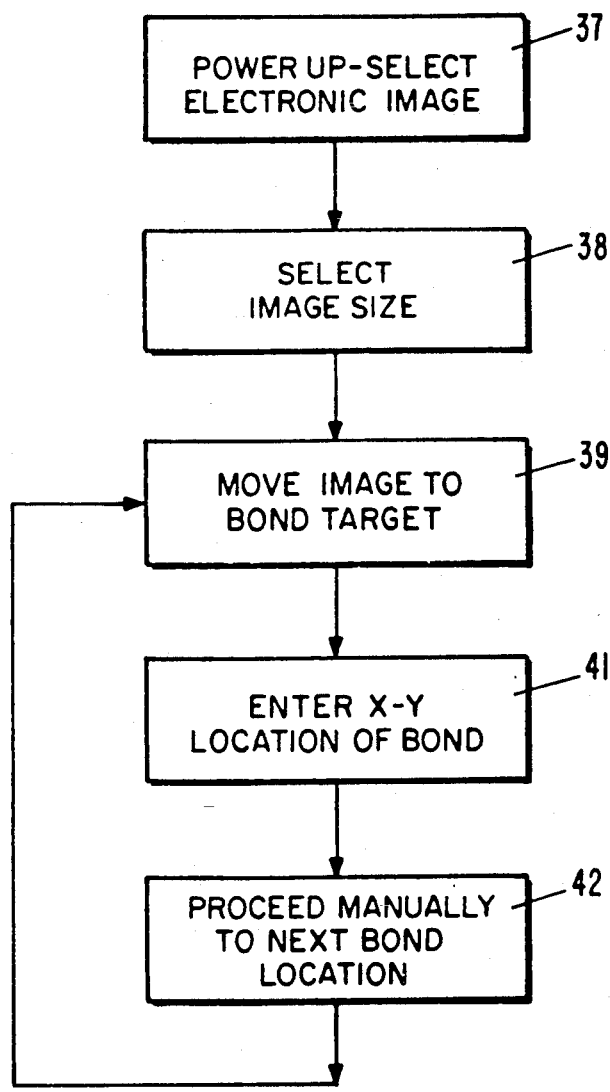
FIG. 7 is a flow diagram depicting the steps performed in a typical prior art teach operation of a bond target position.

Refer now to FIG. 7 showing a flow chart depicting the steps performed in a typical prior art teach operation. Block 37 indicates that the automatic wire bonder and its pattern recognition system is powered up and the operator has selected an electronic image of the type explained herein before with reference to FIG. 2 Block 38 indicates that the electronic image size may be varied to accommodate the size of the pad or lead being targeted for the teach operation. In the prior art system the operator was required to move the electronic image to a bond target on the pad or lead as close to center as visually and dexterously possible as shown in block 39. Having once located the bonding target at block 39, it is now possible to press an enter key which records the XY coordinates of the targeted location or electronic indicia as shown at block 41. In the prior art teach system, it was necessary to manually maneuver the electronic image to each of the bonding points on the pads and leads of the device to be bonded as shown at block 42. One of the prior art methods used by a typical large semiconductor manufacturer was to sequence the pattern recognition system through a sequence simulating the bonding operation after performing the teach operation to perform the following: if the electronic cross-hair representative of the bonding point is on a lead at a desired bonding point, then a corridor for scanning may be displayed and rotated so that it is orthogonal to the edges of the lead so that this corridor would be used during the actual production operations to scan for the width of the lead. During this secondary teach operation, the width of the lead may be recorded and used as a check to determine if the leads actually being bonded during bonding operations are the same width as the lead taught on the reference device. Thus, if the actual bonding width of the device being bonded did not fall within the program tolerance of the width permitted, the bonding operation would cease and require manual assistance.

Figure 8:
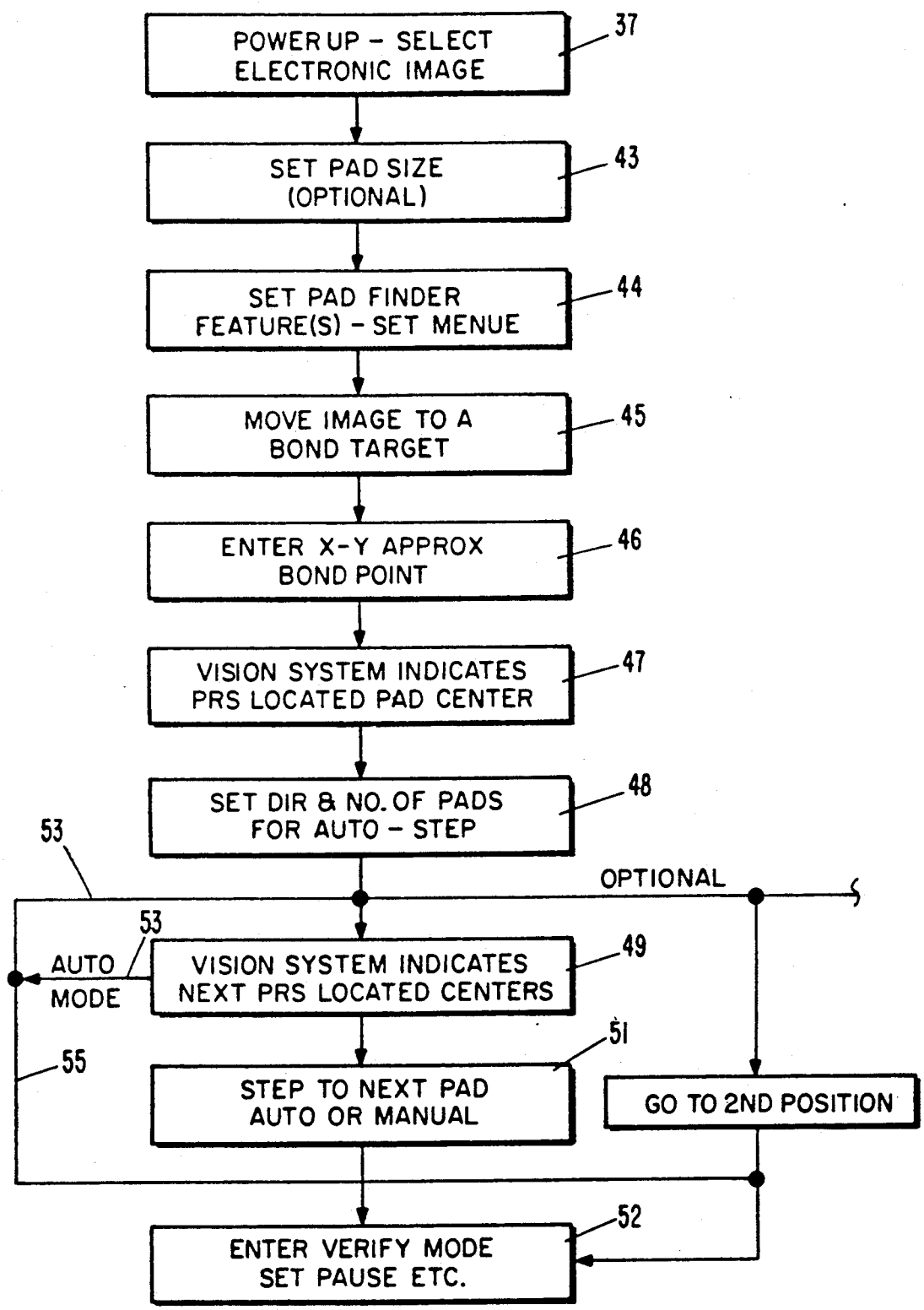
FIG. 8 is a flow chart depicting the steps which may be performed in teaching a series of first bond positions using the present invention.

Refer now to FIG. 8 showing a flow chart depicting the steps which may be performed in teaching a series or first bond positions using the present invention. The block 37 is similar to the block 37 in FIG. 7 in which an electronic image or indicia is selected. In the present invention, the pad size may be programmed into the PRS system as a check option as shown in block 43. In block 44 it is possible to set the pad finder or deactivate the pad finder for different reasons. For example, some devices require rectangular pads for multiple bonds and the pad finder feature is not used for such pads. In order to start the auto teach operation, it is necessary to start at a reference point. While such a reference point could be located automatically, it is extremely difficult and in a preferred embodiment of the present invention the electronic image is moved to the first bond target as shown in block 45. As long as the electronic image is on or embraces the bond target point, it is possible to enter an X-Y approximate bond point and the pattern recognition systems locates the exact desired center bonding point as shown in block 47. The vision system indicates the automatically selected bonding pad center and bonding point as shown at block 47 during the teach operation. It is now possible to enter various information into the pattern recognition system such as the number of bonding points to be located in sequence or a series of step operations. The direction in which the sequence is to be executed and the approximate pitch to the next bonding point as shown in block 48. By now pressing the start or enter button a whole series of automatic center locations for bonding points is performed. This sequence of operations occurs so rapidly that it is impossible to visually check the system accuracy and it is shown at block 49 that each sequence may be repeated to visually indicate the actual bonding point entered into the teach program. This sequence of operations may be conducted automatically with a pause between or may be conducted by a step operation controlled by the operator as shown at block 51. Having checked the location of the bonding points, it is now possible to enter these reference taught program bonding points into the computer of the pattern recognition system as shown at block 52.

In the present invention it is possible to teach all of the pads with the vision system and then teach all of the leads. This may be done automatically or semi-automatically as shown by the loop designated 53. It is also possible to program one pad and then one lead and return to the next pad as shown by the loop 54 which returns after locating the second bond via line 55 which connects to loop 53. It will be understood that in some programs the teach operation is entered automatically having once designated the bonding points without subsequent verification.

Figure 9:
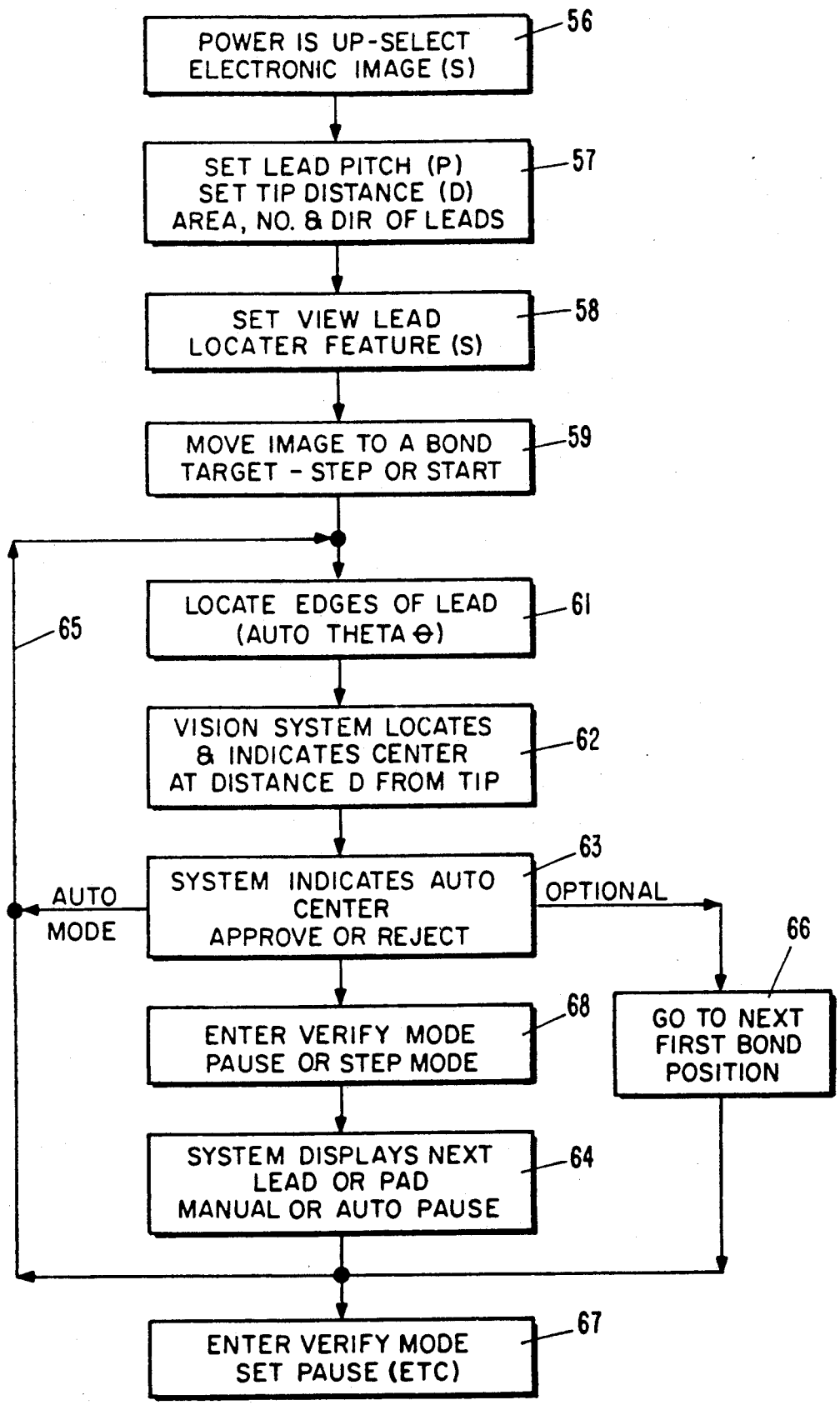
FIG. 9 is a flow chart depicting the steps which may be performed in teaching a series of second bond positions using the present invention.

Refer now to FIG. 9 showing a flow chart depicting the steps which may be performed in teaching a series of second bond positions. It is assumed that power is up and the electronic image for the second bond has been selected and shown at block 56. With the screen and menu active, it is now possible to set the lead tip distance, set the lead pitch, set the target area S and set the number and direction of leads to be sequenced as shown at block 57. Once the lead frame parameters are set, it is now possible to disable the view lead locator (VVL) when an irregular lead is encountered as shown at block 58. It is now possible to start auto lead detection assuming that the view lead locator system is active by moving the electronic image to a bond target and entering a start operation as shown at block 59. After the start or enter button is depressed, the PRS system performs the auto theta scan operation described hereinbefore and locates the edges of the lead being taught or learned as shown at block 61. The vision system now indicates the located lead center and determines the distance D from the tip which was previously entered as a desired parameter as shown at block 62. The bonding point or target point 27 so determined by the auto teach operation is now indicated and may be approved or rejected as shown at block 63. It is now possible to enter into an automatic series of teach operations or to manually step from one lead to the next lead as shown at block 64 and as each lead target point is selected the pattern recognition system may automatically teach the next bonding point on the next lead via loop 65.

It is possible to bypass the manual or pause feature and enter the automatic loop 65 or it is possible to go to a next first bond position as shown at block 66 after the first bond position is located in a manner explained heretofore with reference to FIG. 8. The pattern recognition system comes back to the second bond via the auto loop 65 and the pattern recognition system does an automatic theta and locates the edges of the next lead as shown at block 61. While the enter verify mode-set pause block 67 is shown as the last block in the sequence, it is possible to conduct verification of individual bonding points by inserting this functional block at block 68 between blocks 63 and 64.

Having explained a preferred embodiment of the present invention with reference FIGS. 8 and FIG. 9 where the auto teach operation is the dominant feature of the present invention, it will be understood that the identical structure and mode of operation of part of the teach operation is again employed during the actual bond operation to relocate the bonding target positions on the pads and leads prior to conducting an automatic bond operation with an automatic bonding machine. For most semiconductor devices, the location of the pad on the semiconductor device can be manufactured so accurately during production the semi-conduction devices and again located during a teach operation by the electronic PRS system that individual pad relocation is usually not required during a bonding operation. When mil spec semiconductor devices and very expensive devices are being bonded it may be desirable to buy the insurance of the time required for the auto teach operation auto relocate operation of all of the bonding pads prior to conducting the bonding process which may be done in approximately 0.050 seconds. This could increase the bonding time of the device by up to approximately 50%, but produces near perfect yields.

In the preferred embodiment of the present invention, it is possible to program the pattern recognition system to only bond on first and second bond target positions which meets specified tolerance positions and eliminate or skip the wire connections where target bond positions are indicated that could cause inoperable devices. Thus, the present invention serves as a inspection or check of the integrity of the parts being bonded. In the prior art pattern recognition systems no such check was ever performed. In the prior art the bonding targets for first and second bonds were not relocated for each device being production bonded prior to actual bonding operations.

One of the reasons the prior art pattern recognition systems were not able to relocate the bonding target position on the leads accurately was because the tip geometries of the leads of most lead frames are not in a straight line adjacent to each other nor are they cut orthogonal to the sides of the lead edges. The present invention system having located the preferred bonding point in the center of the lead is capable of locating or relocating this bonding point at an accurate distance from the tip which was not done heretofore.

What is claimed is:

1. A method of automatically teaching target bonding points on pads and leads of semiconductor devices to be bonded with an automatic wire bonder of the type having a pattern recognition system (PRS) comprising the steps of:

manually locating the proximity of a first target to be bonded on a reference semiconductor device in a PRS system of the type having electronic indicia indicating the point to be automatically wire bonded, manually directing said PRS system to automatically find and record an accurate predetermined first target bonding point thereon, stepping said PRS system to the proximity of a second bonding point which is located a predetermined distance and direction from said first target bonding point, manually directing said PRS system to automatically teach and record an accurate predetermined second target bonding point on a pad or lead at said second bonding point, repeating the steps of stepping and directing performed at said second bonding point at a plurality of other bonding points, and storing first and second target bonding points in a memory to provide an accurate reference bonding program for said PRS system of said automatic wire bonder.

2. A method as set forth in claim 1, wherein said step of directing said PRS system to find and record an accurate predetermined first target bonding point comprises the steps of:

scanning a portion of a PRS memory map containing pixel gray level intensity values, processing said pixel intensity values to located the edges of the target electrode to be bonded, and locating the first target bonding point at the exact center between edges of the target electrodes.

3. A method as set forth in claim 2 wherein the step of locating the first target bonding point at the exact center between edges of the target electrode comprises, electronically scanning a corridor which tranverses the edges of said target electrode at a plurality of different angles to determine the scan angle having the narrowest edge width, and calculating said exact center as being at one half of the narrowest width.

4. A method as set forth in claim 1 wherein the step of locating a first target to be bonded comprises locating the target on a lead out pad of a semiconductor device.

5. A method as set forth in claim 4 wherein the step of stepping said PRS system to a second bonding point comprises stepping to an adjacent lead out pad located at a pitch P away from said first target to be bonded.

6. A method as set forth in claim 4 wherein the step of stepping said PRS system to a second bonding point comprises stepping to a lead frame lead juxtaposed said lead out pad.

7. A method as set forth in claim 1 wherein the step of repeating the steps of stepping and directing comprises directing said PRS system to repeating a predetermined number of times, and then
   waiting for another instruction of step and repeat directions.

8. A method as set forth in claim 7 which further includes the steps of directing a plurality of step and repeat directions culminating in a teach program of all bonding electrodes to the wire bonded, and
   checking target bonding points of said teach program automatically.

9. A method as set forth in claim 8 wherein said step of checking target bonding points automatically comprises,
   locating the second target bonding points on said lead frame leads at a predetermined distance D from the top of the leads.

10. A method as set forth in claim 1 wherein said step of directing said PRS system to find and record an accurate predetermined second target bonding point comprises,
    automatically scanning another portion of said memory map,
    processing pixel intensity values to locate a tip edge of a lead frame lead, and
    relocating the target bonding point on said lead frame leads a predetermined distance D from said tip edge.

11. A method of automatically relocating target bonding points previously located, comprising the steps of:
    automatically teaching the exact center of a plurality of reference bonding pads to provide a plurality of taught first bond targets bonding points on a reference device,
    automatically teaching the exact center of a plurality of reference lead frame leads to provide a plurality of taught second bond target bonding points on said referenced device,
    automatically teaching and relocating said exact center of said reference lead frame leads a predetermined distance D from the tip of each lead frame lead to be bonded, and
    prior to making first and second fine wire bonds at said taught first bond target bonding points and said bond relocated exact center taught bonding points of said lead frame leads,
    automatically scanning the lead frame leads of production semiconductor devices to be wire bonded to again relocate the exact center of said production lead frame leads immediately prior to making each second wire bond.

12. A method as set forth in claim 11 wherein the step of automatically scanning the lead frame leads of production semiconductor devices comprises,
    first scanning said lead frame leads to establish the edges of the located leads,
    determining the exact center of said located leads, and
    relocating said exact center of said lead frame leads a predetermined distance D from the tip of each lead frame lead to be bonded.

13. A method as set forth in claim 12 wherein the step of determining said exact center of said lead frame leads comprises the step of scanning a narrow corridor of pixel values stored in a memory map to determine the narrowest width W.

14. A method as set forth in claim 13 wherein the step of scanning comprises scanning a plurality of corridors at different rotational angles.

15. A method as set forth in claim 11 which further includes the step of automatically relocating the exact center of said bonding pads prior to making each first wire bond.

* * * * *